US012666851B2

(12) United States Patent (10) Patent No.: US 12,666,851 B2
Zuo (45) Date of Patent: Jun. 23, 2026

(54) DISPLAY PANEL

(71) Applicant: WUHAN CHINA STAR OPTOELECTRONICS TECHNOLOGY CO., LTD., Wuhan (CN)

(72) Inventor: Xiang Zuo, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 399 days.

(21) Appl. No.: 18/564,451

(22) PCT Filed: Oct. 12, 2023

(86) PCT No.: PCT/CN2023/124272
§ 371 (c)(1),
(2) Date: Nov. 27, 2023

(87) PCT Pub. No.: WO2025/055039
PCT Pub. Date: Mar. 20, 2025

(65) Prior Publication Data
US 2025/0089539 A1 Mar. 13, 2025

(30) Foreign Application Priority Data

Sep. 11, 2023 (CN) .......................... 202311171184.3

(51) Int. Cl.
*H10K 59/80* (2023.01)
*H10K 59/122* (2023.01)
*H10K 59/40* (2023.01)

(52) U.S. Cl.
CPC ......... *H10K 59/879* (2023.02); *H10K 59/122* (2023.02); *H10K 59/40* (2023.02)

(58) Field of Classification Search
CPC ..... H10K 59/879; H10K 59/122; H10K 59/40
See application file for complete search history.

(56) References Cited

U.S. PATENT DOCUMENTS

2020/0373459 A1* 11/2020 Han ...................... H10K 59/122
2024/0258464 A1* 8/2024 Lee ..................... H10H 20/8312

FOREIGN PATENT DOCUMENTS

CN 109755287 A 5/2019
CN 115132947 A 9/2022
(Continued)

OTHER PUBLICATIONS

PCT International Search Report for International Application No. PCT/CN2023/124272, mailed on Apr. 8, 2024, 9pp.
(Continued)

*Primary Examiner* — Thanh Y. Tran
(74) *Attorney, Agent, or Firm* — The Roy Gross Law Firm, LLC; Roy D. Gross

(57) ABSTRACT
An embodiment is provided a display panel. The display panel includes a substrate, a light-emitting layer layer, an insulating layer, and a flat layer. The insulating layer includes a plurality of protruding portions and and adjacent to grooves between the protruding portions. A first side wall curve by a side wall of each of the protruding portions comprises a first arc line and a second arc line. A center point of the first arc line and a center point of the second arc line are respectively located on one side of the side wall that is biased toward each of the protruding portions and one side that is biased toward each of the grooves.

20 Claims, 5 Drawing Sheets

(56) References Cited

FOREIGN PATENT DOCUMENTS

| | | | |
|---|---|---|---|
| CN | 115274861 | A | 11/2022 |
| CN | 115440913 | A | 12/2022 |
| CN | 116669464 | A | 8/2023 |
| CN | 117500333 | A | 2/2024 |
| KR | 20210048465 | A | 5/2021 |

OTHER PUBLICATIONS

PCT Written Opinion of the International Searching Authority for International Application No. PCT/CN2023/124272, mailed on Apr. 8, 2024, 8pp.

\* cited by examiner

DISPLAY PANEL

CROSS REFERENCE TO RELATED APPLICATIONS

This application is a National Phase of PCT Patent Application No. PCT/CN2023/124272, having International filing date of Oct. 12, 2023, which claims the benefit of priority of Chinese Patent Application No. 202311171184.3, filed Sep. 11, 2023, the contents of which are all incorporated herein by reference in their entirety.

TECHNICAL FIELD

The present disclosure relates to the display technology field, and more particularly to a display panel.

BACKGROUND ART

Organic light-emitting diodes (OLED) display panels have high luminous efficiency and fast response speed, can be produced in flexible substrates, have advantages of anti-bending and wide viewing angles, and are loved by the majority of users. In order to improve light extraction efficiency of an OLED display panel, a microlens structure usually used for light extraction. However, as shown in FIG. 1, a straight line is formed by a sidewall 107' of an existing microlens structure 104' intersecting with a section of a substrate perpendicular to a display panel. Improvement in light extraction efficiency of display panels is limited, and it is difficult to significantly improve the light extraction efficiency of the display panel.

Therefore, there is an urgent need to solve the display panel in the above-mentioned technical problem.

Technical Problem

The disclosure provides a display panel capable of alleviate the technical problem that the current microlens structure has limited improvement in the light extraction efficiency of the display panel and that it is difficult to significantly improve the light extraction efficiency of the display panel.

Technical Solution

In order to solve the above-mentioned problem, a technical solution provided by the present disclosure is as follows.

A display panel by the present disclosure includes:

a substrate;

a light-emitting layer disposed on one side of the substrate, and the light-emitting layer including a plurality of pixel units;

an insulating layer disposed on one side of the light-emitting layer away from the substrate, and the insulating layer including a plurality of protruding portions corresponding to the pixel units and adjacent to grooves between the protruding portions; and a flat layer disposed on one side of the insulating layer away from the substrate, and a refractive index of the flat layer being smaller than a refractive index of the insulating layer;

wherein a side wall of each of the protruding portions comprises a first side wall curve, the first side wall curve is formed by the side wall and a section perpendicular to the substrate, the first side wall curve comprises a first arc line and a second arc line, a center point of the first arc line is located on one side of the side wall that is biased toward each of the protruding portions, and a center point of the second arc line is located on one side of the side wall that is biased toward each of the grooves.

Preferably, the first arc line is biased toward each of the grooves to be convex, and the second arc line is biased toward each of the protruding portions to be concave.

Preferably, the first arc line is disposed between the second arc line and the substrate.

Preferably, the first arc line has a first height in a direction perpendicular to the substrate, and the second arc line has a second height in the direction perpendicular to the substrate; and wherein the first height is greater than or equal to the second height.

Preferably, the first side wall curve further comprises: a third arc line, wherein a center point of the third arc line is located on the one side of the side wall that is biased toward each of the protruding portions, and the second arc line is disposed on the first arc line and the third arc line.

Preferably, the first arc line has a first height in a direction perpendicular to the substrate, the second arc line has a second height in the direction perpendicular to the substrate, and the third arc line has a third height in the direction perpendicular to the substrate; and wherein the first height is greater than or equal to the second height, and the second height is greater than or equal to the third height.

Preferably, the first side wall curve further comprises: a fourth arc line, wherein a center point of the fourth arc line is located on the side of the side wall that is biased toward each of the grooves, and the third arc line is disposed between the second arc line and the fourth arc line.

Preferably, the third arc line is biased toward each of the grooves to be convex, and the fourth arc line is biased toward each of the protruding portions to be concave.

Preferably, the first side wall curve further comprises: a fifth arc line, wherein a center point of the fifth arc line is located on the side of the side wall that is biased toward each of the protruding portions, and the fourth arc line is disposed between the third arc line and the fifth arc line.

Preferably, the first side wall curve further comprises: a sixth arc line, wherein a center point of the fifth arc line is located on the side of the side wall that is biased toward each of the grooves, and the fifth arc line is disposed between the fourth arc line and the sixth arc line.

Preferably, the fifth arc line is biased toward each of the grooves to be convex, and the sixth arc line is biased toward each of the protruding portions to be concave.

Preferably, the second arc line is disposed between the first arc line and the substrate.

Preferably, along a direction from the base plate to each of the protruding portions, one end of the first arc line close to the second arc line is tangent to one end of the second arc line close to the first arc line.

Preferably, a curvature radius at each point in the first arc line is greater than 0.6 microns and smaller than 3 microns, and a curvature radius at each point in the second arc line is greater than 0.6 microns and smaller than 3 microns.

Preferably, each of the protruding portions comprises a first surface close to the substrate and a second surface away from the substrate;

the first surface and the second surface intersect with a same section perpendicular to the substrate to form a first intersection line and a second intersection line, and a length of the first intersection line is greater than a length of the second intersection line; and the first arc line and the second arc line are disposed between the first intersection line and the second intersection line.

Preferably, the first arc line comprises a first vertex, and a first acute angle at which a tangent of the first arc via the first vertex intersects with the first intersection line is 20 degrees to 55 degrees; and the second art line comprises a second vertex, and a second acute angle at which a tangent of the second arc via the second vertex intersects with the second intersection line is 20 degrees to 55 degrees.

Preferably, the display panel further comprises:

an encapsulation layer disposed on the one side of the light-emitting layer away from the substrate;

a touch layer disposed on one side of the encapsulation layer away from the substrate, and the touch layer including: the insulating layer, the flat layer, a first metal layer, and a second metal layer, wherein the insulating layer comprises a first insulating sub-layer and a second insulating sub-layer which are stacked, the first metal layer is disposed between the first insulating sub-layer and the second insulating sub-layer, and the second metal layer is disposed between the second insulating sub-layer and the flat layer.

Preferably, the second metal layer comprises touch electrodes corresponding to the pixel units, and the first metal layer comprises touch traces corresponding to the pixel units;

the insulating layer further comprises: each of insulating portions is disposed in each of the pixel units, and each of the grooves is disposed between each of the insulating portions and each of the protruding portions; and each of the insulating portions comprises: a first insulator-sub corresponds to the first insulator sub-layer and a second insulator-sub corresponds to the second insulator sub-layer, each of the touch traces is disposed between the first insulator-sub and the second insulator-sub, and each of the touch electrodes is disposed between the second insulator-sub and the flat layer.

Preferably, a thickness of the insulating layer is greater than or equal to 0.5 microns.

Preferably, the insulating layer comprises an inorganic material, and the flat layer comprises an organic material.

Advantageous Effects

In the present disclosure, the side wall of each of the protruding portions forms the first side wall curve. The first side wall curve forms the first arc line with the center point located on the side wall biased toward each of the protruding portions and the second arc line with the center point located on the side wall biased toward each of the grooves, so as to effectively improve the light extraction efficiency of the display panel, reduce the power consumption of the display panel, and extend the service life of the display panel.

DETAILED DESCRIPTION OF EMBODIMENTS

Figure 1:
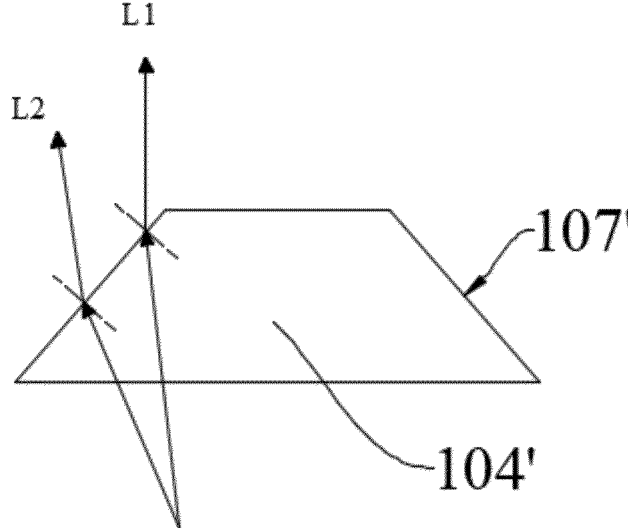
FIG. 1 illustrates a structural schematic diagram of a microlens structure in the prior art.

The present disclosure provides a display panel. To make the objectives, technical schemes, and technical effects of the present disclosure more clearly and definitely, the present disclosure will be described in detail below by using embodiments in conjunction with the appending drawings. It should be understood that the specific embodiments described herein are merely for explaining the present disclosure but are not intended to limit the present disclosure.

Currently, a microlens structure utilized in a display panel has limited improvement in light extraction efficiency of the display panel, and there is a technical problem that it is difficult to effectively improve the light extraction efficiency of the display panel.

Please refer to FIG. 2 to FIG. 11. An embodiment of the present disclosure provides a display panel 100 including:

a substrate 101;

a light-emitting layer 102 disposed on one side of the substrate 101, and the light-emitting layer 102 including a plurality of pixel units 102a;

an insulating layer 103 disposed on side of the light-emitting layer 102 away from the substrate 101, and the insulating layer 103 including a plurality of protruding portions 104 corresponding to the pixel units 102a and adjacent to grooves 105 between the protruding portions 104; and a flat layer 106 disposed on one side of the insulating layer 103 away from the substrate 101, and a refractive index of the flat layer 106 being smaller than a refractive index of the insulating layer 103;

wherein a side wall 107 of each of the protruding portions 104 includes a first side wall curve 108, the first side wall curve 108 is formed by the side wall 107 and a section perpendicular to the substrate 101, the first side wall curve 108 includes a first arc line 108*a* and a second arc line 108*b*, a center point of the first arc line 108*a* is located on one side of the side wall 107 that is biased toward each of the protruding portions 104, and a center of the second arc line 108*b* is located on one side of the side wall 107 that is biased toward each of the grooves 105.

In the embodiment of the present disclosure, the first side wall curve 108 is formed by disposing the side wall of each of the protruding portions 104. In the first side wall curve 108, the center point of the first arc line 108*a* is located on the one side of the side wall 107 that is biased toward each of the protruding portions 104, and the second arc line 108*b* is located on the one side of the side wall 107 that is biased toward each of the grooves 105. This effectively improves the light extraction efficiency of the display panel, reduces power consumption of the display panel, and extends service life of the display panel.

Currently, a technical solution of the present disclosure will now be described with reference to an embodiment.

Figure 5:
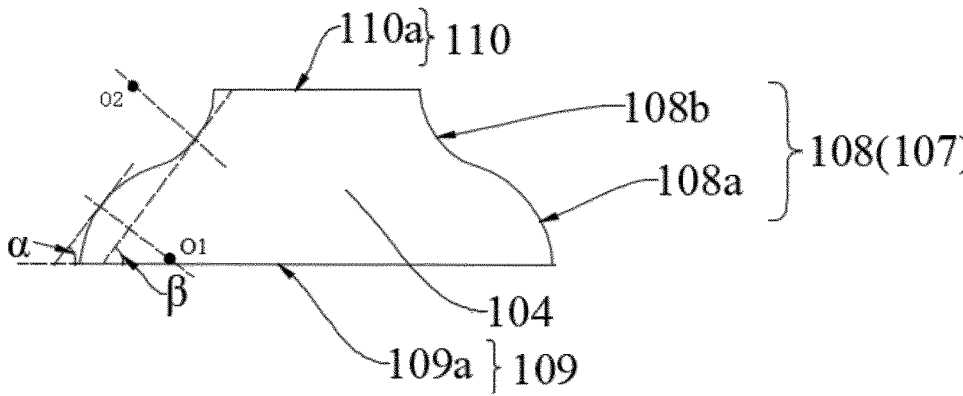
FIG. 5 illustrates a schematic structural diagram of a second structure of a protruding portion of a display panel provided by an embodiment of the present disclosure.
Figure 6:
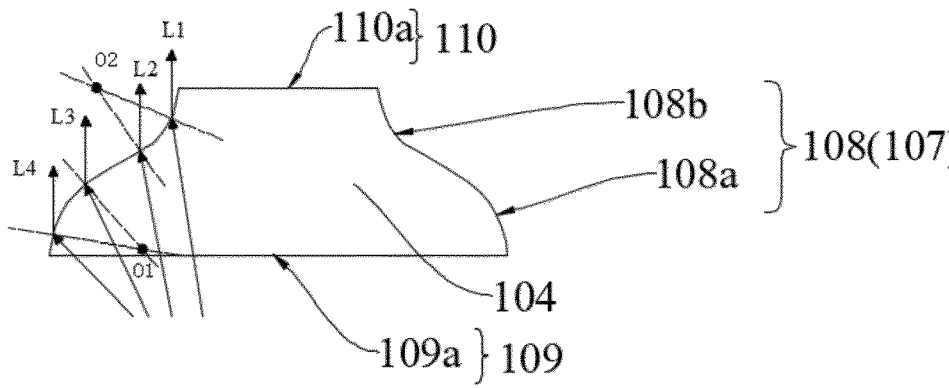
FIG. 6 illustrates a schematic structural diagram of a third structure of a protruding portion of a display panel provided by an embodiment of the present disclosure.
Figure 8:
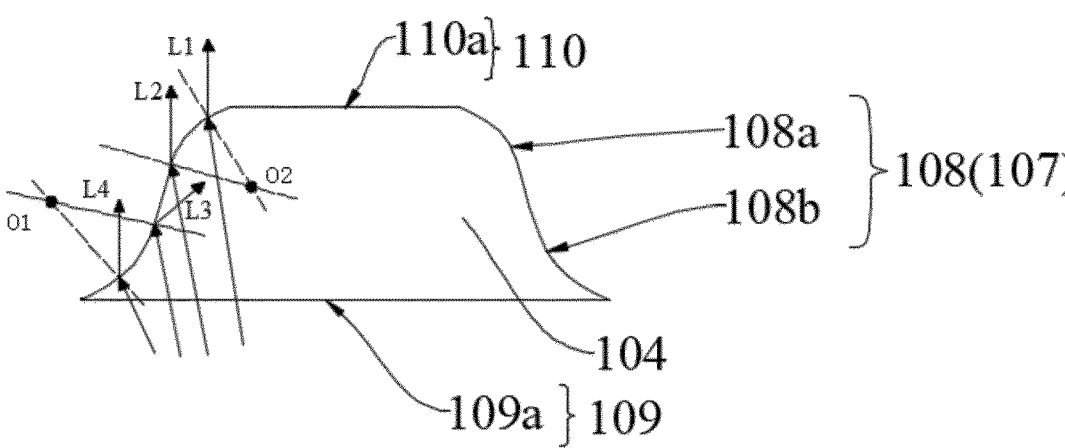
FIG. 8 illustrates a schematic structural diagram of a fourth structure of a protruding portion of a display panel provided by an embodiment of the present disclosure.

In the present embodiment, please refer to FIG. 5, FIG. 6, and FIG. 8. A center point O1 of the first arc line 108*a* is a center of a circle corresponding to at least three points on the first arc line 108*a*. The center point O1 of the first arc 108*a* is located on the one side of the side wall 107 that is biased toward each of the protruding portions 104. That is, the center point of the circle corresponding to the at least three points on the first arc line 108*a* is located on the side wall 107 that is biased toward each of the protruding portions 104.

In the present embodiment, please refer to FIG. 5, FIG. 6, and FIG. 8. A center point O2 of the second arc line 108*b* is a center of the circle corresponding to at least three points on the second arc 108*b*. The center point O2 of the second arc line 108*b* is located on the side of the side wall 107 that is biased toward each of the grooves 105. That is, the center point of the circle corresponding to the at least three points on the second arc line 108*b* is located on the one side of the side wall 107 that is biased toward each of the grooves 105.

In some embodiments, the first arc line 108*a* is convex biased toward each of the grooves 105, and the second arc line 108*b* is concave biased toward the protruding portions 104. Please refer to FIG. 1 and FIG. 4. When the first side wall curve 108 includes the first arc line 108*a* and the second arc line 108*b*, a normal direction is difference compared with a first side wall curve 108 being a straight line. More light is emitted by the pixel units 102*a*, and incident light on the side wall 107 occurs and light is emitted on the side wall 107 to perpendicular to a direction the display surface of the display panel. This is more beneficial for improving the light extraction efficiency of the display panel by each of the protruding portions 104. A convex direction and a concave direction of the first arc 108*a* and the second arc 108*b* are different. It is possible for improving the incident angles of the pixel units 102*a* and the side wall 107 and the exiting angle of the side wall. It is beneficial for the light to exit the direction of the display panel particularly, and it is more beneficial for improving the light extraction efficiency of the display panel 100 by each of the protruding portions 104. It can be understood that the light exiting from a direction perpendicular to the display surface of the display panel refers to that the angle which the exiting direction the light and the display surface of the display panel is ranged from 85 degrees to the 95 degrees.

In some embodiments, the first arc line 108*a* is disposed between the second arc line 108*b* and the substrate 101.

Alternatively, the second arc line 108*b* is disposed between the first arc line 108*a* and the substrate 101.

Please refer to FIG. 6. When multiple lights L1 to L4 are incident on the side wall 107, in a direction from the substrate 101 to the each of protruding portions 104, a normal of the incident light is different in continuous and alternating arcs which are first convex and then concave. Accordingly, under a condition that a law of refraction is satisfied to particular the light exiting from the display surface of the display panel, thereby improving that a light extraction rate of the display panel 100 at a front viewing angle. Please refer to FIG. 8 again. When the multiple light rays L1 to L4 are incident on the side wall 107, in the direction from the substrate 101 to each of the protruding portions 104, the normal of the incident light is different in continuous and alternating arcs which are first convex and then concave. Since there are more light rays (shown in the light ray 3) that are incident on an intersection of the first arc line 108*a* and the second arc line 108*b*, an incident angle is too large and a total reflection occurs, thereby reducing the light extraction rate. Accordingly, the first arc line 108*a* is disposed between the second arc line 108*b* and the substrate 101 preferably.

Figure 7:
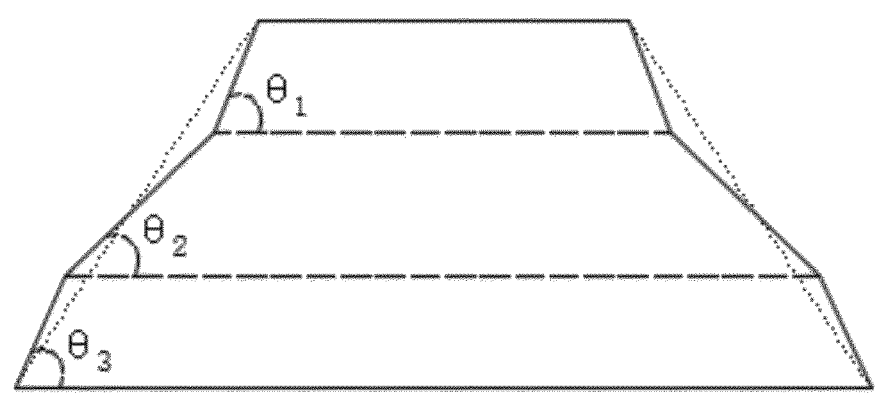
FIG. 7 illustrates a schematic structural diagram of a straight edge approximation of a protruding portion in FIG. 6.
Figure 9:
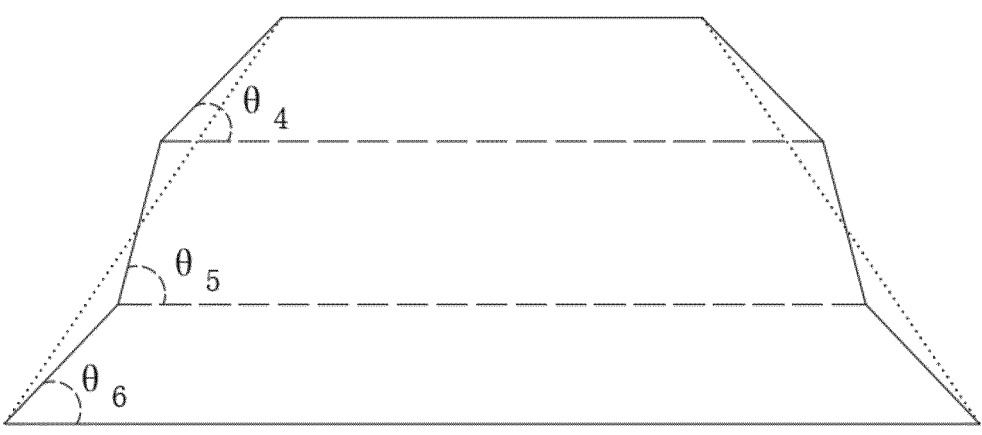
FIG. 9 illustrates a schematic structural diagram of a straight edge approximation of a protruding portion in FIG. 8.

In some embodiments, each of the protruding portions 104 includes a first surface 109 close to the substrate 101 and a second surface 110 away from the substrate 101. The first surface 109 and the second surface 110 intersect with the same section perpendicular to the substrate 101 to form a first intersection line 109*a* and a second intersection line 110*a*. The first arc line 108*a* and the second arc line 108*b* are disposed between the first intersection line 109*a* and the second intersection line 110*a*. The first arc line 108*a* includes a first vertex, and the first vertex is a farthest point on the first arc line 108*a* from a center point of the first arc line 108*a*. Alternatively, when the first arc line 108*a* is an arc, the first vertex is a midpoint on the first arc line 108*a*. The second arc line 108*b* includes a second vertex, and the second vertex is a farthest point on the second arc line 108*b* from a center point of the second arc line 108*b*. Alternatively, when the second arc line 108*b* is an arc, the second vertex is a midpoint on the second arc line 108*b*. Please refer to FIG. 6 to FIG. 9. It can also be proved from another aspect that it is preferable that the first arc line 108*a* is disposed between the second arc line 108*b* and the substrate 101. Specifically, the first arc line 108*a* and the second arc 108*b* line in the first side wall curve 108 in FIG. 6 and FIG. 9 can be approximated by a straight edge (as shown in FIG. 7 and FIG. 9). That is, one end of each of the protruding portions 104 close to the substrate 101 is connected to three-segment straight lines via one end of the first intersection 109*a*, the first vertex of the first arc line 108*a*, the second vertex of the second arc line 108*b*, and the second intersection line 110*a*. When the first arc line 108*a* is located between the second arc line 108*b* and the substrate 101, in a direction from each of the protruding portions 104 to the substrate 101, angles are θ1, θ2, and θ3 along straight lines and the first intersection line 109*a*. When the second arc line 108*b* is located between the first arc line 108*a* and the substrate 101, in a direction from each of the protruding portions 104 to the substrate 101, angle θ4, θ5, and θ6 are along straight lines and the first intersection line 109*a*. When a shape of the first arc line 108*a* is the same and a shape of the second arc line 108*b* is the same, θ1 is equal to θ6 and θ3 is equal to θ4. Two structural differences mainly focus on θ2 and θ5. At this time, θ5 is greater than θ2. It can be seen from FIG. 11 that when an angle is greater than 30 degrees, the increase in the light extraction rate of the display panel 100 decreases as the angle increases. Therefore, when the first arc line 108a is located between the second arc line 108b and the substrate 101, the light extraction efficiency of the display panel 100 is higher.

In some embodiments, along a direction from the substrate 101 to each of the protruding portions 104, one end of the first arc line 108a close to the second arc line 108b is tangent to one end of the second arc line 108b close to the first arc line 108a, so as to a smooth transition between the first arc line 108a and the second arc line 108b.

In some embodiments, in the first side wall curve 108, a convex curved surface toward away from the first intersection line 109a is easier for the light incident on the side wall 107 to emit light from the side wall 107 perpendicular to the display surface of the display panel. Therefore, the first arc line 108a has a first height in a direction perpendicular to the substrate 101, and the second arc line 108b has a second height in the direction perpendicular to the substrate 101. The first height is greater than or equal to the second height.

In some embodiments, in the first side wall curve 108, center points of multiple arc segments are located on the side of the side wall 107 that is biased toward each of the protruding portions 104, and the center point of the at least one is segment is located on the side of the side wall 107 that is biased toward each of the grooves 105.

Figure 10:
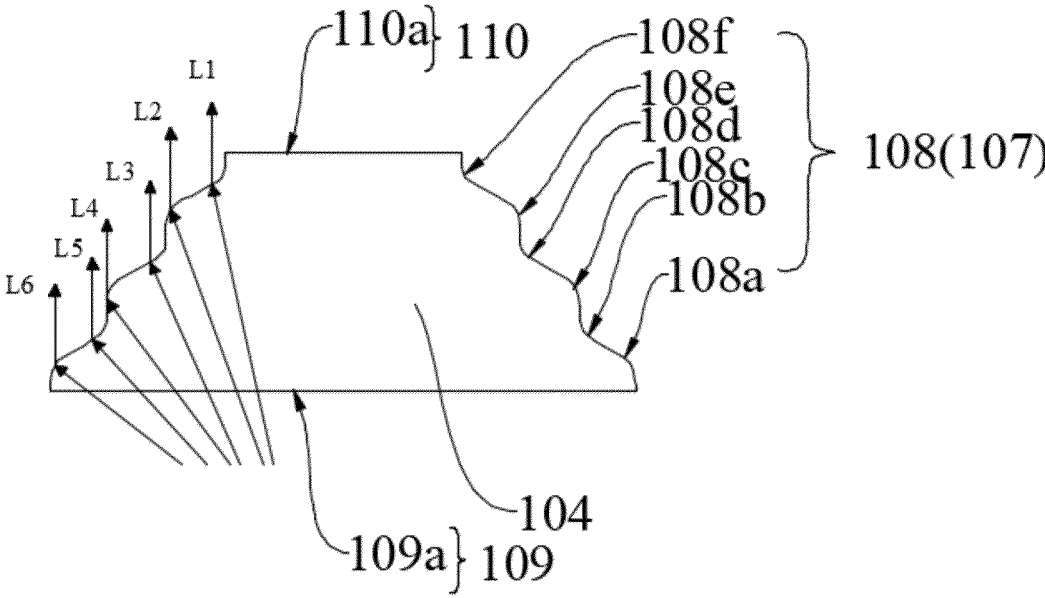
FIG. 10 illustrates a schematic structural diagram of a fifth structure of a protruding portion of a display panel provided by an embodiment of the present disclosure.
Figure 11:
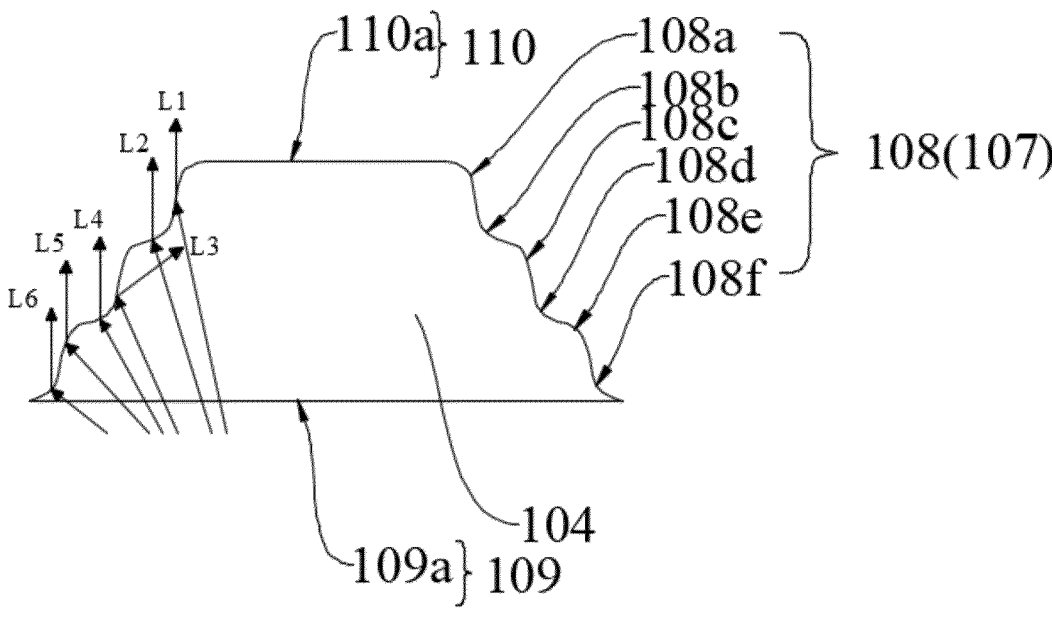
FIG. 11 illustrates a schematic structural diagram of a sixth structure of a protruding portion of a display panel provided by an embodiment of the present disclosure.

Please refer to FIG. 10 and FIG. 11. The first side wall curve 108 further includes a third arc line 108c. A center point of the third arc line 108c is located on one side of the side wall 107 that is biased toward each of the protruding portions 104. The second arc line 108b is disposed between the first arc line 108a and the third arc line 108c. The center point of the third arc line 108c is a center of a circle corresponding to at least three points in the third arc 108c. Specifically, the third arc line 108c is convex toward each of the grooves 105. The third arc line 108c is located along the direction from the base plate 101 to each of the protruding portions 104. One end of the third arc line 108c close to the second arc line 108b is tangent to one end of the second arc line 108b close to the third arc line 108c, and one end of the first arc line 108a close to the second arc line 108b is tangent to one end of the second arc line 108b close to the first arc line 108a. Accordingly, a smooth transition is along the first arc line 108a, the second arc line 108b, and the third arc line 108c.

In some embodiments, the first arc line 108a has the first height in the direction perpendicular to the substrate 101, the second arc line 108b has the second height in the direction perpendicular to the substrate 101, and the third arc line 108c has a third height in the direction perpendicular to the substrate 101. A sum of the first height and the third height is greater than or equal to the second height. Preferably, the first height is greater than or equal to the second height, and the second height is greater than or equal to the third height.

Please refer to FIG. 10 and FIG. 11. In some embodiments, the first side wall curve 108 further includes a fourth arc line 108d. A center point of the fourth arc line 108d is located on the side wall 107 that is biased toward each of the grooves 105. The third arc line 108c is disposed between the second arc line 108b and the fourth arc line 108d. The center point of the fourth arc line 108d is a center of a circle corresponding to at least three points in the fourth arc line 108d. Specifically, the fourth arc line 108d is concave toward each of the protruding portions 104. One end of the fourth arc line 108d close to the third arc line 108c is tangent to one end of the third arc line 108c close to the fourth arc line 108d. Accordingly, a smooth transition is along multiple arcs of the first side wall curve 108.

In some embodiments, the fourth arc line 108d has a fourth height in the direction perpendicular to the substrate 101. A sum of the first height and the third height is greater than or equal to a sum of the second height and the fourth height. Preferably, the first height is greater than or equal to the second height, and the third height is greater than or equal to the fourth height.

Please refer to FIG. 10 and FIG. 11. In some embodiments, the first side wall curve 108 further includes a fifth arc line 108e. A center point of the fifth arc line 108e is located in the side wall 107 that is biased toward each of the protruding portions 104. The fourth arc line 108d is disposed between the third arc line 108c and the fifth arc line 108e. The center point of the fifth arc line 108e is a center of a circle corresponding to at least three points in the fifth arc line 108e. Specifically, the fifth arc line 108e is convex toward each of the grooves 105. One end of the fifth arc line 108e close to the fourth arc line 108d is tangent to one end of the fourth arc line 108d close to the fifth arc line 108e. Accordingly, a smooth transition is along multiple arcs of the first side wall curve 108.

In some embodiments, the fifth arc line 108e has a fifth height in the direction perpendicular to the substrate 101. A sum of the first height, the third height, and the fifth height is greater than or equal to a sum of the second height and the fourth height. Preferably, the fifth height is smaller than or equal to the fourth height.

Please refer to FIG. 10 and FIG. 11. In some embodiments, the first side wall curve 108 further includes a sixth arc line 108f. A center point of the sixth arc line 108f is located in the side wall 107 that is biased toward each of the grooves 105. The fifth arc line 108e is disposed between the fourth arc line 108d and the sixth arc line 108f. The center point of the sixth arc line 108f is a center of a circle corresponding to at least three points in the sixth arc line 108f. Specifically, the sixth arc line 108f is concave toward each of the protruding portions 104. One end of the sixth arc line 108f close to the fifth arc line 108e is tangent to one end of the fifth arc line 108e close to the sixth arc line 108f. Accordingly, a smooth transition is along multiple arcs of the first side wall curve 108.

In some embodiments, the sixth arc line 108f has a sixth height in the direction perpendicular to the substrate 101. A sum of the first height, the third height, and the fifth height is greater than or equal to a sum of the second height, the fourth height, and the sixth height. Preferably, the first height is greater than or equal to the second height, the third height is greater than or equal to the fourth height, and the fifth height is greater than or equal to the sixth height.

Figure 12:
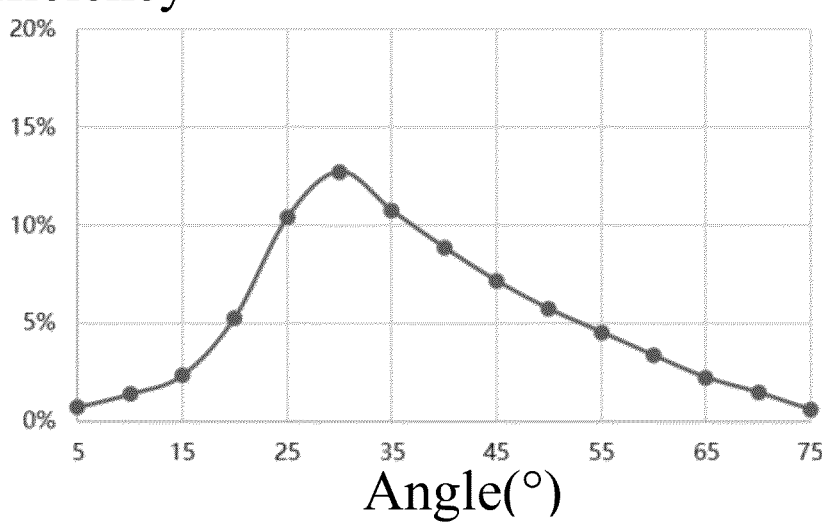
FIG. 12 illustrates impact of improved luminous efficiency of an angle $\alpha$ of a protruding portion of a display panel and/or an angle $\beta$ provided by an embodiment of the present disclosure.

In some embodiments, a first acute angle at which a tangent of the first arc 108a via the first vertex intersects the first intersection line 109a is from 20 degrees to 55 degrees, for example, 30 degrees, 35 degrees, 40 degrees, 45 degrees, 50 degrees or the like; and/or a second acute angle at which a tangent of the second arc 108b via the second vertex intersects the first intersection line 109a is from 20 degrees to 55 degrees, for example, 30 degrees, 35 degrees, 40 degrees, 45 degrees, 50 degrees or the like. Please refer to FIG. 12. The inventor discovers during the research that the first acute angle α at which the tangent of the first arc line 108a via the first vertex and the first intersection line 109a are formed and/or the second acute angle β at which the tangent of the second arc line 108b via the second vertex and the first intersection line 109a are formed first increases and then decreases the light extraction efficiency (such as a green pixel unit) of the display panel 100. When the first acute angle α at which the tangent of the first arc line 108a via the first vertex and the first intersection line 109a are formed and/or the second acute angle β at which the tangent of the second arc 108b line via the second vertex and the first intersection line 109a are formed is smaller than 30 degrees, the light extraction efficiency of the display panel 100 is increased with the increasing of an angle. When the first acute angle α at which the tangent of the first arc line 108a via the first vertex and the first intersection line 109a are formed and/or the second acute angle β at which the tangent of the second arc line 108b via the second vertex and the first intersection line 109a are formed is greater than 30 degrees, the light extraction efficiency of the display panel 100 is decreased with the increasing of an angle. Accordingly, when the first acute angle α at which the tangent of the first arc line 108a via the first vertex and the first intersection line 109a are formed and/or the second acute angle β at which the tangent of the second arc line 108b via the second vertex and the first intersection line 109a are formed is greater or equal to 20 degrees and smaller than or equal to 55 degrees, it is beneficial for each of the protruding portions 104 to greatly improve the light extraction efficiency of the display panel 100.

When the first side wall curve 108 further includes the third arc line 108. The third arc line 108c includes a third vertex. A third acute angle at which a tangent of the third arc line 108c via the third vertex intersects the first intersection line 109a is from 20 degrees to 55 degrees, for example, 30 degrees, 35 degrees, 40 degrees, 45 degrees, 50 degrees or the like. The third vertex is similar to the first vertex and the second vertex. The third vertex is the farthest point in the third arc line 108c from the center point of the third arc line 108c. Alternatively, when the third arc line 108c is an arc, the third vertex is the midpoint in the third arc line 108c.

When the first side wall curve 108 further includes the fourth arc line 108d, the fourth arc line 108d includes a fourth vertex. A fourth acute angle at which a tangent of the fourth arc line 108d via the fourth vertex intersects the first intersection line 109a is from 20 degrees to 55 degrees, for example, 30 degrees, 35 degrees, 40 degrees, 45 degrees, 50 degrees or the like. The fourth vertex is similar to the first vertex and the second vertex. The fourth vertex is the farthest point in the fourth arc line 108d from the center point of the fourth arc line 108d. Alternatively, when the fourth arc line 108d is an arc, the fourth vertex is the midpoint in the fourth arc line 108d.

When the first side wall curve 108 further includes the fifth arc line 108e, the fifth arc line 108e includes a fifth vertex. A fifth acute angle at which a tangent of the fifth arc line 108e via the fifth vertex intersects the first intersection line 109a is from 20 degrees to 55 degrees, for example, 30 degrees, 35 degrees, 40 degrees, 45 degrees, 50 degrees or the like. The fifth vertex is similar to the first vertex and the second vertex. The fifth vertex is the farthest point in the fifth arc line 108e from the center point of the fifth arc line 108e. Alternatively, when the fifth arc line 108e is an arc, the fifth vertex is the midpoint in the fifth arc line 108e.

When the first side wall curve 108 further includes the sixth arc line 108f, the sixth arc line 108f includes a sixth vertex. A sixth acute angle at which a tangent of the sixth arc 108f via the sixth vertex intersects the first intersection line 109a is from 20 degrees to 55 degrees, for example, 30 degrees, 35 degrees, 40 degrees, 45 degrees, 50 degrees or the like. The sixth vertex is similar to the first vertex and the second vertex. The sixth vertex is the farthest point in the sixth arc line 108f from the center point of the sixth arc line 108f. Alternatively, when the sixth arc line 108f is an arc, the sixth vertex is the midpoint in the sixth arc line 108f.

In some embodiments, a curvature radius at each point in each arc segment in the first side wall curve 108 is greater than 0.6 microns, and the curvature radius at each point in each arc segment in the first side wall curve 108 is smaller than 3 microns, for example, 0.8 microns, 1 micron, 1.2 microns, 1.5 microns, 1.8 microns, 2 microns, 2.5 microns. Accordingly, the acute angle formed by the vertex in each of the arc segments in the first side wall curve 108 and the first intersection line 109a is maintained in the range of 20 degrees to 55 degrees, and a proper arc is maintained. Specifically, the curvature radius at each of the points in the first arc line 108a is greater than 0.6 microns and smaller than 3 micros, and the curvature radius at each of the points in the second arc line 108b is greater than 0.6 microns and smaller than 3 micros. When the first side wall curve 108 includes the third arc line 108c, a curvature radius at each point in the third arc line 108c is greater than 0.6 microns and smaller than 3 micros. When the first side wall curve 108 includes the fourth arc line 108d, a curvature radius at each point in the fourth arc 108d is greater than 0.6 microns and smaller than 3 micros. When the first side wall curve 108 includes the fifth arc line 108e, a curvature radius at each point in the fifth arc line 108e is greater than 0.6 microns and smaller than 3 micros. When the first side wall curve 108 includes the sixth arc line 108f, a curvature radius at each point in the sixth arc line 108f is greater than 0.6 microns and smaller than 3 micros.

Figure 2:
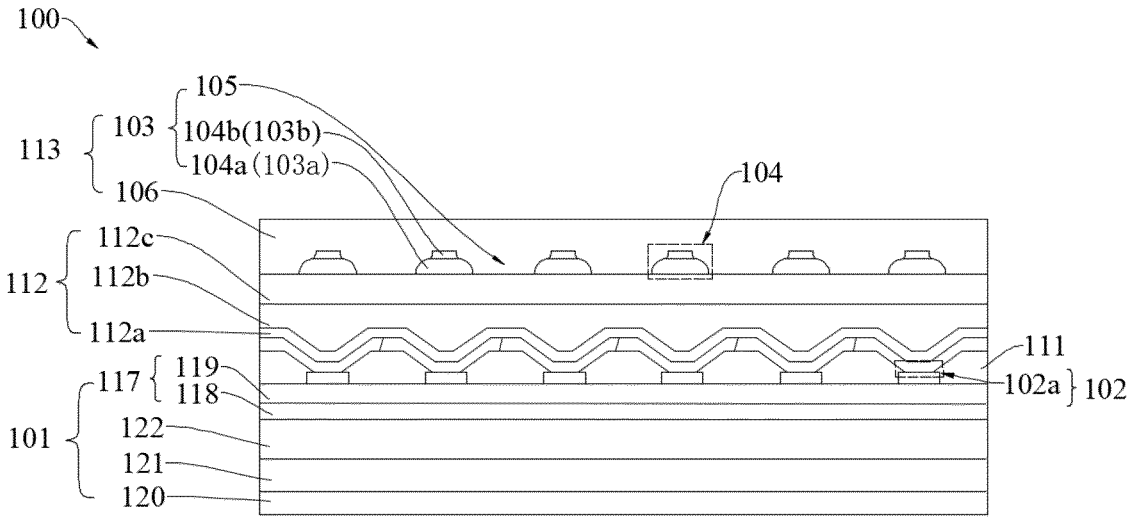
FIG. 2 illustrates a schematic structural diagram of a first structure of a display panel provided by an embodiment of the present disclosure.

Please refer to FIG. 2. In some embodiments, the display panel 100 further includes a pixel definition layer 111. The pixel definition layer 111 and the pixel unit 102a are located in the same side of the substrate 101. The pixel definition layer 111 includes pixel definition portions and first openings between the pixel definition portions. Each of the pixel units 102a is located in each of the first openings. Each of the protruding portions 104 is disposed corresponding to each of the first openings.

In some embodiments, an orthographic projection of each of the pixel units 102a in a plane of the second surface 110 of each of the protruding portions 104 is located in the second surface 110. The orthographic projection of the first surface 109 in the plane of the second surface 110 covers the second surface 110. A length of the first intersection line 109a is greater than a length of the second intersection line 110a, so that more and more light as possible from each of the pixel units 102a can change the exit direction through the side wall 107, and more and more light can be emitted in a direction perpendicular to the display surface of the display panel to improve the light extraction rate of the display panel 100.

In some embodiments, the display panel 100 includes anodes, the light-emitting layer 102, and cathode layers. Each of the anodes is located on each of the first openings, and each of the pixel definition portions surrounds the anode and covers an edge of each of the anodes. The light-emitting layer 102 is located on ono side of the pixel definition layer 111 away from the substrate 101. Each of the cathode layers covers the light-emitting layer 102. Along a direction from the each of the anodes to each of the cathode layers, the light-emitting layer 102 includes a hole-injecting organic layer, a light-emitting material layer, and an electronic organic layer which are stacked in sequence. The hole-injecting organic layer can include a hole injection layer and a hole transport layer. The hole injection layer is in direct contact with the anode. The hole transport layer is located between the hole injection layer and the light-emitting material layer. The hole-injecting organic layer can further include an electron blocking layer located between the hole transport layer and the light-emitting material layer. The electronic organic layer can include an electron injection layer and an electron transport layer. The electron injection layer is in direct contact with the cathode layer. The electron transport layer is located between the electron injection layer and the luminescent material layer. The electronic organic layer can further include a hole blocking layer located between the electron transport layer and the light-emitting material layer.

The light-emitting layer 102 disposed the each of the first openings comprises each of the pixel units 102a. When the display panel 100 is displayed, the pixel units 102a for display emit the light, and at least a part of the pixel units 102a emit light. The light passes through each of the protruding portions 104 and changes its exit angle, so that it exits in a direction perpendicular to the display surface of the display panel, thereby improving the light extraction rate of the display panel 100.

In some embodiments, the display panel 100 further includes an encapsulation layer 112 disposed on one side of the light-emitting layer 102 away from the substrate 101. The encapsulation layer 112 can be formed by alternately laminating one or more organic layers and one or more inorganic layers. The inorganic layers or the organic layers can be multiples. The organic layer is formed by a polymer and can be formed by any one of a laminated or single layer of polyethylene terephthalate, polyimide, polycarbonate, epoxy resin, polyethylene, and polyacrylate. The organic layer can be formed by polyacrylate and specifically can include a substance obtained by polymerizing a composition including a diacrylate-based monomer and a triacrylate-based monomer. Monoacrylate-based monomers can also be included in the monomer composition. Further, the monomer composition can also include well-known photoinitiators such as TPO, but the monomer composition is not limited thereto. The inorganic layer can be a laminated layer or a single layer including metal oxide or metal nitride. For example, the inorganic layer can include any one of $SiN_x$, $Al_2O_3$, $SiO_2$, and $TiO_2$. The encapsulation layer 112 can sequentially include a first inorganic encapsulation layer 112a, a first organic encapsulation layer 112b, and a second inorganic encapsulation layer 112c located in the cathode layer in a direction away from the substrate 101 (as shown in FIG. 1). Furthermore, the encapsulation layer 112 can sequentially include the first inorganic encapsulation layer, the first organic encapsulation layer, the second inorganic encapsulation layer, a second organic encapsulation layer, and a third inorganic encapsulation layer in the cathode layer in a direction away from the substrate 101. Furthermore, the encapsulation layer 112 can sequentially include the first inorganic encapsulation layer, the first organic encapsulation layer, the second inorganic encapsulation layer, the second organic encapsulation layer, the third inorganic encapsulation layer, a third organic encapsulation layer, and a fourth inorganic encapsulation layer.

Figure 3:
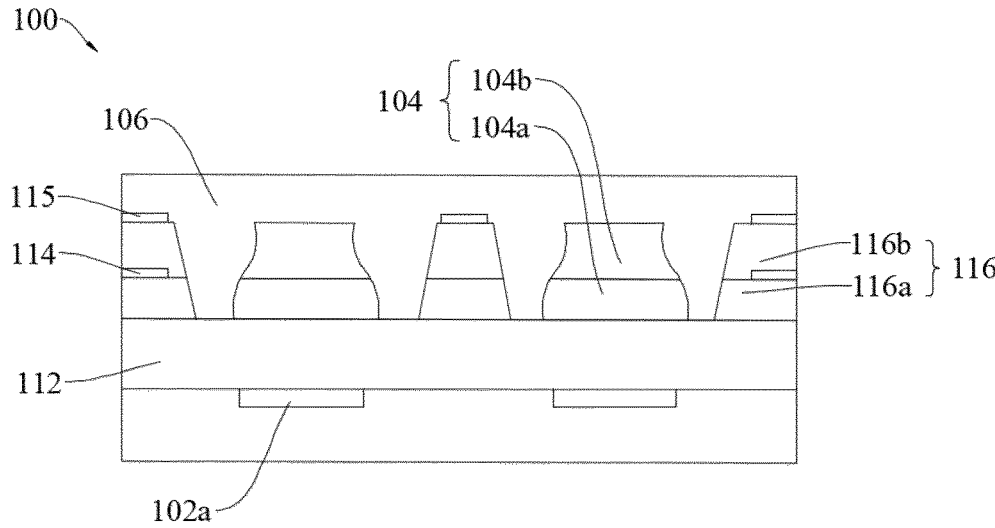
FIG. 3 illustrates a schematic structural diagram of a second structure of a display panel provided by an embodiment of the present disclosure.
Figure 4:
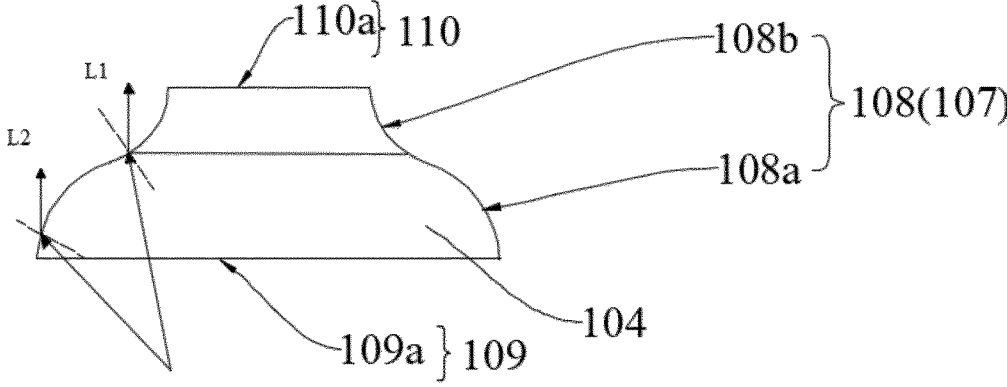
FIG. 4 illustrates a schematic structural diagram of a first structure of a protruding portion of a display panel provided by an embodiment of the present disclosure.

Please refer to FIG. 2 and FIG. 3. In some embodiments, the display panel 100 further includes a touch layer 113. The touch layer 113 is disposed in one side of the encapsulation layer 112 away from the substrate 101. The touch layer 113 includes the insulating layer 103, the flat layer 106, a first metal layer 114, and a second metal layer 115. The insulating layer 103 includes a first insulating sub-layer 103a and a second insulating sub-layer 103b which are stacked. The first metal layer 114 is disposed between the first insulating sub-layer 103a and the second insulating sub-layer 103b. The second metal layer 115 is disposed between the second insulating sub-layer 103b and the flat layer 106.

In some embodiments, the second metal layer 115 includes touch electrodes corresponding to the pixel units 102a, and the first metal layer 114 includes touch traces corresponding to the pixel units 102a.

Please refer to FIG. 2 and FIG. 3. In some embodiments, the insulating layer 103 further includes insulating portions 116 disposed between the pixel units 102a. The grooves 105 are disposed between the insulating portions 116 and the protruding portions 104. Each of the insulating portions 116 includes a first insulating sub-portion 116a corresponding to the first insulating sub-layer 103a and a second insulating sub-portion 116b corresponding to the second insulating sub-layer 103b. The touch traces are disposed between the first insulating sub-portions 116a and the second insulating portions 116b, and the touch electrode are provided between the second insulator portions 116b and the flat layer 106.

In some embodiments, the flat layer 106 covers the insulating layer 103. Each of the grooves 105 forms a second opening exposing the encapsulation layer 112, covers the flat layer 106 of the second opening, and is in direct contact with the encapsulation layer 112.

In some embodiments, the flat layer 106 includes an organic material to flatten the touch layer 113 away from one surface of the substrate 101.

In some embodiments, a difference in the refractive index between each of the protruding portions 104 and the flat layer 106 is greater than or equal to 0.3, and the difference in the refractive index between each of the protruding portions 104 and the flat layer 106 is smaller than or equal to 0.5, for example, 0.35, 0.4, 0.45 or the like.

In some embodiments, the insulating layer 103 includes an inorganic material. It can be effectively separated between the first metal layer 114 and the second metal layer 115 by using the less inorganic material to an insulating effect. In the meantime, it is more likely to produce a refractive difference when the insulating layer 103 includes an inorganic material and the flat layer 106 includes an organic material. Therefore, it is easier to change the emission angle of the light passing through the side wall 107, so that more light exits at an angle perpendicular to the display surface of the display panel to improve the light extraction efficiency of the display panel.

Please refer to FIG. 2 and FIG. 3. In some embodiments, each of the protruding portions 104 includes a first protruding sub-portion 104a located on the first insulating sub-layer 103a and a second protruding sub-portion 104b located on the second insulating sub-layer 103b. Each of the protruding portions 104 can comprise the first protruding sub-portion 104a and the second protruding sub-portion part 104b. A difference in the refractive index exists or does not exist difference between the first sub-lens and the second sub-lens. In the meantime, a difference in a refractive index between the first protruding sub-portion 104a and the flat layer 106 is greater than or equal to 0.3, and the difference in the refractive index between the first protruding sub-portion 104a and the flat layer 106 is smaller than or equal to 0.3. A difference in a refractive index between the second protruding sub-portion 104b and the flat layer 106 is greater than or equal to 0.3, and the difference in the refractive index between the second protruding sub-portion 104b and the flat layer 106 is smaller than or equal to 0.3.

In some embodiments, a thickness of each of the protruding portions 104 is greater than or equal to 0.5 microns to effectively improve the light extraction rate of the display panel 100, for example, 0.6 microns, 0.8 microns, 1 micron, 1.5 microns, 2 microns or the like.

Please refer to FIG. 2. In some embodiments, the substrate 101 includes a substrate 120, a buffer layer 121 located on one side of the substrate 120, a thin film transistor layer 122 located on one side of the buffer layer 121 away from the substrate 120, and a second flat layer 117 on the one side away from the substrate 120.

The substrate 120 can be a hard substrate 120, such as a glass substrate 120. Alternatively, the substrate 120 can be a flexible substrate 120, such as a polyimide substrate. When the substrate 120 is the flexible substrate 120, the substrate 120 includes a first flexible sub-substrate 120, an intermediate layer, an adhesive layer, and a second flexible sub-substrate 120. The first flexible sub-substrate 120 and the second flexible sub-substrate 120 can be formed of the same material such as polyimide. The intermediate layer can be formed of, for example, an inorganic material including at least one of SiOx and SiNx. The adhesive layer can be formed of hydrogenated amorphous silicon (a-Si:H).

The buffer layer 121 can include one or more inorganic insulating layers. The inorganic insulating layer includes a material such as silicon oxide or silicon nitride. The buffer layer 121 can provide a planarization layer on an upper surface of the substrate 120 and can block or prevent impurities and moisture from penetrating from the substrate 120 into the light-emitting layer. Specifically, the buffer layer 121 includes a first sub-buffer layer 121 formed of, for example, silicon nitride, and a second sub-buffer layer 121 formed of, for example, silicon oxide. The second sub-buffer layer 121 and the first sub-buffer layer 121 can be formed of silicon nitride with the same film quality (for example, the same density and the same film stress), and an oxide film can be positioned at an interface between the second sub-buffer layer 121 and the first sub-buffer layer 121. In practical applications, a thickness of the first sub-buffer layer 121 can be 50 nm to 100 nm, and a thickness of the second sub-buffer layer 121 can be approximately 100 nm to 300 nm.

The thin film transistor layer 122 includes a thin film transistor. The thin film transistor includes a semiconductor formed on the buffer layer 121. The semiconductor can be formed of polysilicon. The semiconductor is divided into a channel region and divided into a source region and a drain region formed on both sides of the channel region. The channel region of the semiconductor is polysilicon without doped impurities, that is, an intrinsic semiconductor. The source region and the drain region are polysilicon doped with conductive impurities, that is, impurity semiconductors. The impurities doped into the source region and the drain region can be either P-type impurities or N-type impurities. The thin film transistor layer 122 further includes a first gate insulating layer. The first gate insulating layer covers the semiconductor. The first gate insulating layer can be a plurality of layers or a single layer including at least one of tetraethyl orthosilicate (TEOS), silicon nitride, silicon oxide and so on.

The thin film transistor further includes a first gate formed on the first gate insulating layer. The first gate overlaps the channel region. The first gate can be formed as multiple layers or a single layer including a low-resistance material, such as Al, Ti, Mo, Cu, Ni, or alloys thereof, or materials with high anti-corrosion properties or a material. The thin film transistor layer 122 further includes a second gate insulating layer. The second gate insulating layer covers the first gate. The second gate insulating layer can be a plurality of layers or a single layer including at least one of tetraethyl orthosilicate (TEOS), silicon nitride, silicon oxide or the like. The thin film transistor further includes a second gate formed on the second gate insulating layer. The second gate overlaps the first gate. The second gate can be formed as multiple layers or a single layer including a low-resistance material, such as Al, Ti, Mo, Cu, Ni, or alloys thereof, or materials with high anti-corrosion properties or a material. The thin film transistor layer 122 further includes a first interlayer insulating layer formed on the second gate electrode. The first interlayer insulating layer can be formed as a plurality of layers or a single layer formed of, for example, tetraethyl orthosilicate (TEOS), silicon nitride, or silicon oxide. The first interlayer insulating layer, the first gate insulating layer, and the second gate insulating layer include a source contact hole and a drain contact hole. The source region and the drain region are exposed through the source contact hole and the drain contact hole respectively.

The thin film transistor further includes a source electrode and a drain electrode arranged in the same layer, and both are formed on the first interlayer insulating layer. The source electrode is connected to the source region through the source contact hole, and the drain electrode is connected to the drain region through the drain contact hole. Each of the source electrode and the drain electrode gate can be formed as multiple layers or a single layer including a low-resistance material, such as Al, Ti, Mo, Cu, Ni, or alloys thereof, or materials with high anti-corrosion properties or a material. For example, each of the source electrode and the drain electrode can be a triple layer of Ti/Cu/Ti, Ti/Ag/Ti, Ti/Al/Ti, or Mo/Al/Mo, or other single-layer or multi-layer structures.

The second flat layer 117 is formed on the source electrode and the drain electrode. The second flat layer 117 can be formed as a plurality of layers or a single layer formed of, for example, tetraethyl orthosilicate (TEOS), silicon nitride, or silicon oxide, and can be formed of Formed from organic materials with low dielectric constant (for example, polyimide). The second flat layer 117 can include a first flat sub-layer 118 and a second flat sub-layer 119. The first flat sub-layer 118 is located on one side of the second flat sub-layer 119 close to the substrate 120.

The substrate 101 further includes a metal transfer layer between the first planar sub-layer 118 and the second planar sub-layer 119. The anode is connected to the thin film transistor through the metal transfer layer.

In some embodiments, the display panel 100 further includes a cover layer located on the side of the flat layer 106 away from the substrate 101. The cover layer can be a flexible cover.

In some embodiments, the display panel 100 further includes a polarizing layer located between the cover layer and the flat layer 106.

In the display panel 100 provided by the embodiment of the present disclosure, the side wall of each of the protruding portions 104 forms the first side wall curve 108. The first side wall curve 108 forms the first arc 108*a* with the center point located on the side wall biased toward each of the protruding portions 104 and the second arc 108*b* with the center point located on the side wall biased toward each of the grooves 105, so as to effectively improve the light extraction efficiency of the display panel, reduce the power consumption of the display panel, and extend the service life of the display panel.

The embodiment of the present disclosure provides the display panel. The display panel includes the substrate, the light-emitting layer, the insulating layer, and the flat layer. The insulating layer includes the protruding portions and the grooves disposed between the protruding portions. The first side wall curve formed by the side wall of each of the protruding portions includes the first arc line and the second arc line. The center point of the first arc line and the center point of the second arc line are respectively located on the side wall that is biased toward each of the protruding portions and the side that is biased toward each of the grooves. In the present disclosure, the side wall of each of the protruding portions forms the first side wall curve. The first side wall curve 108 forms the first arc 108a with the center point located on the side wall biased toward each of the protruding portions 104 and the second arc 108b with the center point located on the side wall biased toward each of the grooves 105, so as to effectively improve the light extraction efficiency of the display panel, reduce the power consumption of the display panel, and extend the service life of the display panel.

It should be understood that the present disclosure is not limited to the exemplary examples. Those skilled in the art may achieve equivalent improvements or replacements according to the above description. The equivalent improvements and replacements should be considered to belong to the protection scope of the present disclosure.

What is claimed is:

1. A display panel, comprising:
a substrate;
a light-emitting layer disposed on one side of the substrate, and the light-emitting layer comprising a plurality of pixel units;
an insulating layer disposed on one side of the light-emitting layer away from the substrate, and the insulating layer comprising a plurality of protruding portions corresponding to the pixel units and adjacent to grooves between the protruding portions; and
a flat layer disposed on one side of the insulating layer away from the substrate, and a refractive index of the flat layer being smaller than a refractive index of the insulating layer;
wherein a side wall of each of the protruding portions comprises a first side wall curve, the first side wall curve is formed by the side wall and a section perpendicular to the substrate, the first side wall curve comprises a first arc line and a second arc line, a center point of the first arc line is located on one side of the side wall that is biased toward each of the protruding portions, and a center point of the second arc line is located on one side of the side wall that is biased toward each of the grooves.

2. The display panel of claim 1, wherein the first arc line is biased toward each of the grooves to be convex, and the second arc line is biased toward each of the protruding portions to be concave.

3. The display panel of claim 1, wherein the first arc line is disposed between the second arc line and the substrate.

4. The display panel of claim 3, wherein the first arc line has a first height in a direction perpendicular to the substrate, and the second arc line has a second height in the direction perpendicular to the substrate; and
wherein the first height is greater than or equal to the second height.

5. The display panel of claim 3, wherein the first side wall curve further comprises:
a third arc line, wherein a center point of the third arc line is located on the one side of the side wall that is biased toward each of the protruding portions, and the second arc line is disposed on the first arc line and the third arc line.

6. The display panel of claim 5, wherein the first arc line has a first height in a direction perpendicular to the substrate, the second arc line has a second height in the direction perpendicular to the substrate, and the third arc line has a third height in the direction perpendicular to the substrate; and
wherein the first height is greater than or equal to the second height, and the second height is greater than or equal to the third height.

7. The display panel of claim 5, wherein the first side wall curve further comprises:
a fourth arc line, wherein a center point of the fourth arc line is located on the side of the side wall that is biased toward each of the grooves, and the third arc line is disposed between the second arc line and the fourth arc line.

8. The display panel of claim 7, wherein the third arc line is biased toward each of the grooves to be convex, and the fourth arc line is biased toward each of the protruding portions to be concave.

9. The display panel of claim 7, wherein the first side wall curve further comprises:
a fifth arc line, wherein a center point of the fifth arc line is located on the side of the side wall that is biased toward each of the protruding portions, and the fourth arc line is disposed between the third arc line and the fifth arc line.

10. The display panel of claim 9, wherein the first side wall curve further comprises:
a sixth arc line, wherein a center point of the fifth arc line is located on the side of the side wall that is biased toward each of the grooves, and the fifth arc line is disposed between the fourth arc line and the sixth arc line.

11. The display panel of claim 10, wherein the fifth arc line is biased toward each of the grooves to be convex, and the sixth arc line is biased toward each of the protruding portions to be concave.

12. The display panel of claim 1, wherein the second arc line is disposed between the first arc line and the substrate.

13. The display panel of claim 1, wherein along a direction from the base plate to each of the protruding portions, one end of the first arc line close to the second arc line is tangent to one end of the second arc line close to the first arc line.

14. The display panel of claim 1, wherein a curvature radius at each point in the first arc line is greater than 0.6 microns and smaller than 3 microns, and a curvature radius at each point in the second arc line is greater than 0.6 microns and smaller than 3 microns.

15. The display panel of claim 1, wherein each of the protruding portions comprises a first surface close to the substrate and a second surface away from the substrate;
the first surface and the second surface intersect with a same section perpendicular to the substrate to form a first intersection line and a second intersection line, and a length of the first intersection line is greater than a length of the second intersection line; and
the first arc line and the second arc line are disposed between the first intersection line and the second intersection line.

16. The display panel of claim 15, wherein the first arc line comprises a first vertex, and a first acute angle at which a tangent of the first arc via the first vertex intersects with the first intersection line is 20 degrees to 55 degrees; and
the second art line comprises a second vertex, and a second acute angle at which a tangent of the second arc via the second vertex intersects with the second intersection line is 20 degrees to 55 degrees.

17. The display panel of claim 1, wherein the display panel further comprises:

an encapsulation layer disposed on the one side of the light-emitting layer away from the substrate;

a touch layer disposed on one side of the encapsulation layer away from the substrate, and the touch layer comprising:

the insulating layer, the flat layer, a first metal layer, and a second metal layer, wherein the insulating layer comprises a first insulating sub-layer and a second insulating sub-layer which are stacked, the first metal layer is disposed between the first insulating sub-layer and the second insulating sub-layer, and the second metal layer is disposed between the second insulating sub-layer and the flat layer.

18. The display panel of claim 17, wherein the second metal layer comprises touch electrodes corresponding to the pixel units, and the first metal layer comprises touch traces corresponding to the pixel units;

the insulating layer further comprises:

each of insulating portions is disposed in each of the pixel units, and each of the grooves is disposed between each of the insulating portions and each of the protruding portions; and each of the insulating portions comprises:

a first insulator-sub corresponds to the first insulator sub-layer and a second insulator-sub corresponds to the second insulator sub-layer, each of the touch traces is disposed between the first insulator-sub and the second insulator-sub, and each of the touch electrodes is disposed between the second insulator-sub and the flat layer.

19. The display panel of claim 1, wherein a thickness of the insulating layer is greater than or equal to 0.5 microns.

20. The display panel of claim 1, wherein the insulating layer comprises an inorganic material, and the flat layer comprises an organic material.

* * * * *